(12) United States Patent
Okawa

(10) Patent No.: US 10,050,108 B2
(45) Date of Patent: Aug. 14, 2018

(54) SEMICONDUCTOR DEVICE

(71) Applicant: TOYOTA JIDOSHA KABUSHIKI KAISHA, Toyota-shi, Aichi (JP)

(72) Inventor: Takashi Okawa, Nisshin (JP)

(73) Assignee: TOYOTA JIDOSHA KABUSHIKI KAISHA, Toyota (JP)

( * ) Notice: Subject to any disclaimer, the term of this patent is extended or adjusted under 35 U.S.C. 154(b) by 0 days.

(21) Appl. No.: 15/671,503

(22) Filed: Aug. 8, 2017

(65) Prior Publication Data

US 2018/0090571 A1    Mar. 29, 2018

(30) Foreign Application Priority Data

Sep. 28, 2016  (JP) ................. 2016-189852

(51) Int. Cl.

| H01L 29/08 | (2006.01) |
|---|---|
| H01L 27/04 | (2006.01) |
| H01L 29/06 | (2006.01) |
| H01L 29/16 | (2006.01) |
| H01L 29/423 | (2006.01) |
| H01L 29/78 | (2006.01) |
| H01L 29/20 | (2006.01) |

(52) U.S. Cl.
CPC ......... H01L 29/0878 (2013.01); H01L 27/04 (2013.01); H01L 29/0615 (2013.01); H01L 29/1608 (2013.01); H01L 29/4232 (2013.01); H01L 29/7801 (2013.01); H01L 29/2003 (2013.01)

(58) Field of Classification Search
CPC . H01L 29/0878; H01L 27/04; H01L 29/0615; H01L 29/1608; H01L 29/4232; H01L 29/7801; H01L 29/2003
See application file for complete search history.

(56) References Cited

U.S. PATENT DOCUMENTS

| 8,987,817 B2 * | 3/2015 | Tarui | H01L 23/544 |
|---|---|---|---|
| | | | 257/287 |
| 2004/0119076 A1 * | 6/2004 | Ryu | H01L 21/8213 |
| | | | 257/77 |

(Continued)

FOREIGN PATENT DOCUMENTS

| JP | 2015-041719 A | 3/2015 |
|---|---|---|
| JP | 2018-56297 A | 4/2018 |

*Primary Examiner* — Fernando L Toledo
*Assistant Examiner* — Neil Prasad
(74) *Attorney, Agent, or Firm* — Oliff PLC

(57) ABSTRACT

A semiconductor device may include a semiconductor layer, an insulation gate section, and a first conductivity-type semiconductor region; wherein the semiconductor layer may include a vertical drift region being of a second conductivity type and disposed at the one of main surfaces; a body region being of the first conductivity type, adjoining the vertical drift region, and disposed at the one of main surfaces; and a source region being of the second conductivity type, separated from the vertical drift region by the body region, and disposed at the one of main surfaces, wherein the insulation gate section is opposed to a portion of the body region which separates the vertical drift region and the source region; and the first conductivity-type semiconductor region is opposed to at least a part of a portion of the vertical drift region which is disposed at the one of main surfaces.

5 Claims, 4 Drawing Sheets

(56) References Cited

U.S. PATENT DOCUMENTS

| | | | |
|---|---|---|---|
| 2012/0057386 A1* | 3/2012 | Adachi | H01L 29/1608 363/131 |
| 2012/0309174 A1* | 12/2012 | Hiyoshi | H01L 29/66068 438/478 |
| 2015/0053999 A1 | 2/2015 | Kumagai | |
| 2018/0090600 A1 | 3/2018 | Tomita et al. | |

* cited by examiner

SEMICONDUCTOR DEVICE

TECHNICAL FIELD

A technique disclosed herein relates to a semiconductor device.

BACKGROUND

A conventional semiconductor device 100 shown in FIG. 4 includes an n-type semiconductor substrate 110, a semiconductor layer 120 stacked on the semiconductor substrate 110, a drain electrode 132 covering a rear surface of the semiconductor substrate 110, a source electrode 134 covering a front surface of the semiconductor layer 120, and an insulation gate section 136 provided on a part of the front surface of the semiconductor layer 120. The semiconductor layer 120 includes an n-type drift region 121, p-type body regions 123, p-type contact regions 124, and n-type source regions 125. The drift region 121 is constituted of a horizontal drift region 121*a* and a vertical drift region 121*b*, and the vertical drift region 121*b* is at the front surface of the semiconductor layer 120. Herein, the vertical drift region 121*b* may be referred to especially as a JFET region.

Each of the body regions 123 is disposed at a position adjoining the vertical drift region 121*b* and disposed at the front surface of the semiconductor layer 120. Each of the contact regions 124 is disposed at the front surface of the semiconductor layer 120 and electrically connected to the source electrode 134. Each of the source regions 125 is separated from the vertical drift region 121*b* by a corresponding one of the body regions 123, disposed at the front surface of the semiconductor layer 120, and electrically connected to the source electrode 134. A gate electrode 136*b* of the insulation gate section 136 is opposed to, via a gate insulation film 136*a*, a portion of each body region 123 which separates the vertical drift region 121*b* and a corresponding one of the source region 125. The gate electrode 136*b* of the insulation gate section 136 is electrically isolated and separated from the source electrode 134 by an interlayer insulation film 152.

When the semiconductor device 100 is on, an inversion layer is formed by a potential of the gate electrode 136*b* in the portion of each body region 123 which separates the vertical drift region 121*b* and the corresponding source region 125, and electrons flow into the vertical drift region 121*b* from the source regions 125 through the inversion layers. The electrons that have flown into the vertical drift region 121*b* flow in the vertical drift region 121*b* in a vertical direction toward the drain electrode 132. Due to this, the drain electrode 132 and the source electrode 134 are electrically connected.

When the semiconductor device 100 is off, a depletion layer extends from each body region 123 into the vertical drift region 121*b*. The vertical drift region 121*b* is designed to turn into a pinch-off state where the depletion layers extending from its both sides connect to each other, during the semiconductor device 100 being off. Due to the vertical drift region 121*b* being pinched off, electric field applied to the gate insulation film 136*a* of the insulation gate section 136 is alleviated, dielectric breakdown of the gate insulation film 136*a* is suppressed, and a breakdown voltage of the semiconductor device 100 is improved. It should be noted that when the semiconductor device 100 turns on, a potential of the vertical drift region 121*b* and a potential of the body regions 123 become substantially equal, and the depletion layer disappears. A JFET structure is constituted of the n-type vertical drift region 121*b* and the p-type body regions 123. Japanese Patent Application Publication No. 2015-041719 discloses an example of a semiconductor device including a vertical drift region (i.e., JFET region).

SUMMARY

In order to suppress the dielectric breakdown of the gate insulation film 136*a* by the vertical drift region 121*b* being favorably pinched off, it is preferable to set an impurity concentration of the vertical drift region 121*b* low. However, if the impurity concentration of the vertical drift region 121*b* is low, electrical resistance of the vertical drift region 121*b* becomes high, and on-resistance of the semiconductor device 100 increases.

As described above, a semiconductor device including a vertical drift region has a trade-off between its breakdown voltage and on-resistance. Therefore, a technique of improving such a trade-off relation has been desired to be developed for a semiconductor device including a vertical drift region.

A semiconductor device disclosed herein may comprise a semiconductor layer, an insulation gate section provided on a part of one of main surfaces of the semiconductor layer, and a first conductivity-type semiconductor region provided on another part of the one of main surfaces. The semiconductor layer may comprise a vertical drift region being of a second conductivity type and disposed at the one of main surfaces, a body region being of the first conductivity type, adjoining the vertical drift region, and disposed at the one of main surfaces; and a source region being of the second conductivity type, separated from the vertical drift region by the body region, and disposed at the one of main surfaces. The insulation gate section is opposed to a portion of the body region which separates the vertical drift region and the source region. The first conductivity-type semiconductor region is opposed to at least a part of a portion of the vertical drift region which is disposed at the one of main surfaces.

When the above-described semiconductor device is off, a depletion layer extends from the first conductivity-type semiconductor region into the vertical drift region. Due to this, in the semiconductor device, a front surface portion of the vertical drift region can be favorably depleted, and thus electric field applied to a gate insulation film of the insulation gate section which is disposed in a vicinity of the front surface portion of the vertical drift region can be alleviated. In other words, in the semiconductor device, even when an impurity concentration of the vertical drift region is set high, the electric field applied to the gate insulation film of the insulation gate section can be alleviated. As such, the semiconductor device can improve the trade-off relation between its breakdown voltage and on-resistance.

DETAILED DESCRIPTION

Figure 1:
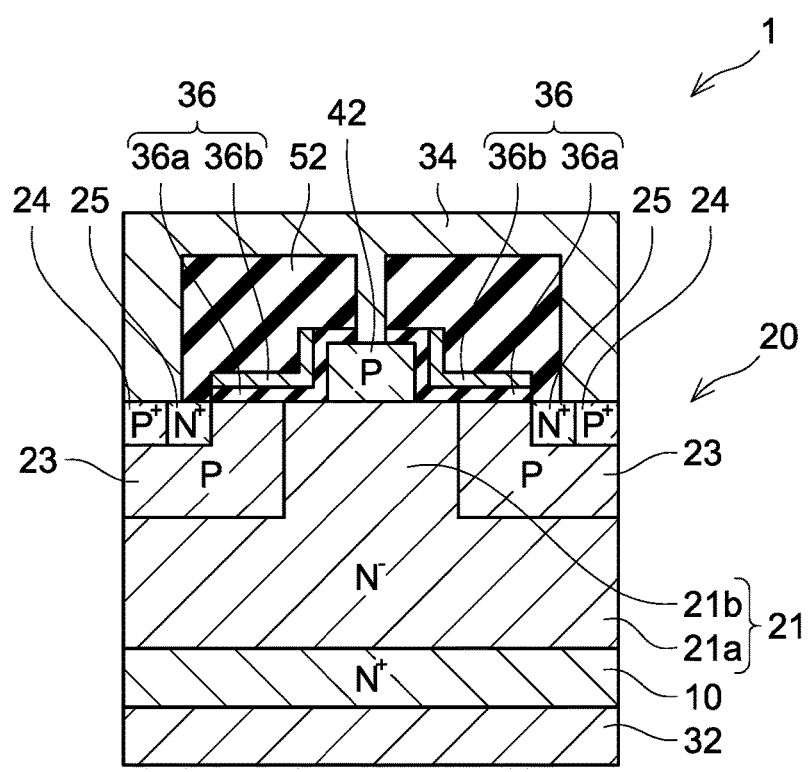
FIG. 1 schematically shows a cross sectional view of a main part of a semiconductor device.

As shown in FIG. 1, a semiconductor device 1 comprises an n-type semiconductor substrate 10, a semiconductor layer 20 stacked on the semiconductor substrate 10, a p-type semiconductor region 42 stacked on a part of the front surface of the semiconductor layer 20, a drain electrode 32 covering a rear surface of the semiconductor substrate 10, a source electrode 34 covering the front surface of the semiconductor layer 20, and an insulation gate section 36 provided on a part of the front surface of the semiconductor layer 20. The semiconductor layer 20 comprises an n-type drift region 21, p-type body regions 23, p-type contact regions 24, and n-type source regions 25. The drift region 21 is constituted of a horizontal drift region 21a and a vertical drift region 21b, and the vertical drift region 21b is disposed at the front surface of the semiconductor layer 20. The p-type semiconductor region 42 is not a part of the semiconductor layer 20, but provided on a part of an upper one of main surfaces of the semiconductor layer 20.

The semiconductor substrate 10 is made of silicon carbide (SiC) containing n-type impurities in high concentration. The drain electrode 32 is in ohmic contact with an entirety of the rear surface of the semiconductor substrate 10. The semiconductor substrate 10 is a base substrate on which the semiconductor layer 20 epitaxially grows.

The semiconductor layer 20 is deposited by epitaxial growth on the semiconductor substrate 10. The semiconductor layer 20 is made of silicon carbide (SiC) containing n-type impurities in lower concentration than that of the semiconductor substrate 10. The semiconductor layer 20 is provided with plural types of diffusion regions to be described later.

The drift region 21 is constituted as a remaining portion after plural types of semiconductor regions have been formed in the semiconductor layer 20, and comprises the horizontal drift region 21a and the vertical drift region 21b. The horizontal drift region 21a is disposed on the semiconductor substrate 10. The vertical drift region 21b is disposed on the horizontal drift region 21a so as to have a convex shape protruding therefrom, and is disposed at a part of the front surface of the semiconductor layer 20. As seen along a direction perpendicular to the front surface of the semiconductor layer 20 (an up-and-down direction on a sheet surface of the drawing), the vertical drift region 21b extends linearly along a longitudinal direction (a direction perpendicular to the sheet surface of the drawing).

The body regions 23 are disposed on the horizontal drift region 21a and respectively on both sides of the vertical drift region 21b, and disposed at the front surface of the semiconductor layer 20. The body regions 23 contain p-type impurities in low concentration. The body regions 23 are formed by radiating nitrogen or aluminum to the front surface of the semiconductor layer 20, using ion implantation technique.

The contact regions 24 are disposed on the body regions 23, and disposed at the front surface of the semiconductor layer 20. The contact regions 24 contain p-type impurities in high concentration, and are in ohmic contact with the source electrode 34. The contact regions 24 are formed by radiating nitrogen or aluminum to the front surface of the semiconductor layer 20, using ion implantation technique.

The source regions 25 are disposed on the body regions 23, separated from the drift region 21 by the respective body regions 23, and disposed at the front surface of the semiconductor layer 20. The source regions 25 contain n-type impurities in high concentration, and are in ohmic contact with the source electrode 34. The source regions 25 are formed by radiating phosphorus to the front surface of the semiconductor layer 20, using ion implantation technique.

The p-type semiconductor region 42 is stacked on a part of the front surface of the semiconductor layer 20. Precisely, the p-type semiconductor region 42 is provided so as to contact a part of a portion of the vertical drift region 21b that is disposed at the front surface of the semiconductor layer 20, and separated from the body regions 23 by the vertical drift region 21b. A thickness of the p-type semiconductor region 42 is thicker than a thickness of a gate insulation film 36a of the insulation gate section 36. The p-type semiconductor region 42 is made of p-type silicon carbide (SiC). The p-type semiconductor region 42 is formed by depositing the p-type silicon carbide on the front surface of the semiconductor layer 20 using epitaxial growth technique, and then performing a patterning thereto using etching technique. The p-type semiconductor region 42 is in ohmic contact with the source electrode 34 through a through hole penetrating an interlayer insulation film 52 and the insulation gate section 36.

The insulation gate section 36 is provided on a part of the front surface of the semiconductor layer 20, and comprises the gate insulation film 36a made of oxide silicon and a gate electrode 36b made of polysilicon. Specifically, the gate insulation film 36a covers a surface of a portion of each body region 23 that separates the vertical drift region 21b and the corresponding source region 25, a surface of the vertical drift region 21b between the p-type semiconductor region 42 and the corresponding body region 23, a side surface of the p-type semiconductor region 42, and a part of a surface of the p-type semiconductor region 42. The gate electrode 36b is opposed to, via the gate insulation film 36a, the portion of the corresponding body region 23 that separates the vertical drift region 21b and the corresponding source region 25 as well as is opposed to, via the gate insulation film 36a, the surface of the vertical drift region 21b between the p-type semiconductor region 42 and the corresponding body region 23. The gate electrode 36b is electrically isolated and separated from the source electrode 34 by the interlayer insulation film 52.

Next, an operation of the semiconductor device 1 will be described. When the semiconductor device 1 is used, a positive voltage is applied to the drain electrode 32, and the source electrode 34 is grounded. When a positive voltage higher than a gate threshold value is applied to the gate electrode 36b, an inversion layer is formed in the portion of each body region 23 that separates the vertical drift region 21b and the corresponding source region 25, and the semiconductor device 1 turns on. At this occasion, electrons flow into the vertical drift region 21b from the source regions 25 through the inversion layers. The electrons flow through the vertical drift region 21b in a vertical direction toward the drain electrode 32. Due to this, the drain electrode 32 and the source electrode 34 are electrically connected.

When the gate electrode 36b is grounded, the inversion layers disappear, and the semiconductor device 1 turns off. At this occasion, a depletion layer starts to extend from each body region 23 into the vertical drift region 21b. In addition, since a junction surface between the p-type semiconductor region 42 and the vertical drift region 21b is reversely biased, a depletion layer also extends from the p-type semiconductor region 42 into the vertical drift region 21b. Due to this, in the semiconductor device 1, a front surface portion of the vertical drift region 21b can be favorably depleted, and thus, electric field applied to the gate insulation film 36a of the insulation gate section 36 that is disposed in a vicinity of the front surface portion of the vertical drift region 21b can be alleviated. Especially, in the semiconductor device 1, the insulation gate section 36 is located on the surface of the vertical drift region 21b, and electric field applied to the gate insulation film 36a located thereon is favorably alleviated. Due to this, dielectric breakdown of the gate insulation film 36a of the insulation gate section 36 is suppressed, and the semiconductor device 1 can have a high breakdown voltage.

In the semiconductor device 1, an impurity concentration of the vertical drift region 21b is high in order to make a JFET resistance of the vertical drift region 21b small. In this case, it is concerned that, when the semiconductor device 1 is oft high electric field may be applied to the gate insulation film 36a of the insulation gate section 36 due to the vertical drift region 21b being suppressed from turning into a pinch-off state where the depletion layers extending from the body regions 23 into the vertical drift region 21b connect to each other. However, as aforementioned, in the semiconductor device 1, prior to the vertical drift region 21b being pinched off, the front surface portion of the vertical drift region 21b is depleted by the depletion layer extending from the p-type semiconductor region 42, and thus electric field applied to the gate insulation film 36a of the insulation gate section 36 is alleviated. That is, even when the impurity concentration of the vertical drift region 21b is set high in order to make an on-resistance low, the dielectric breakdown of the gate insulation film 36a of the insulation gate section 36 can be suppressed and the semiconductor device 1 can have a high breakdown voltage. As a result, the semiconductor device 1 can improve the trade-off relation between its breakdown voltage and on-resistance.

Further, in the semiconductor device 1, the p-type semiconductor region 42 is provided on the front surface of the semiconductor layer 20. In other words, the p-type semiconductor region 42 is not disposed inside the vertical drift region 21b. Due to this, when the semiconductor device 1 is on, a transfer pathway of the electrons is not narrowed, and thus, the on-resistance does not increase.

Further, in the semiconductor device 1, since the p-type semiconductor region 42 is electrically connected to the source electrodes 34, holes are quickly supplied to the depletion layer in the p-type semiconductor region 42 when the semiconductor device 1 turns on. Due to this, when the semiconductor device 1 turns on, the depletion layer in the vertical drift region 21b quickly disappears. As a result, the transfer pathway of the electrons is suppressed from being narrowed by the depletion layer extending into the vertical drift region 21b from the junction surface between the p-type semiconductor region 42 and the vertical drift region 21b, and thus, an increase in turn-on loss can be suppressed.

Further, the semiconductor device 1 is made of silicon carbide. In order to allow high dielectric breakdown field which is a property of silicon carbide to be sufficiently exerted, the semiconductor device 1 made of silicon carbide comprises the semiconductor layer 20 designed to be relatively thin, and is used under a condition where high electric field is applied to the gate insulation film 36a. Since electric field applied to the gate insulation film 36a is alleviated in the semiconductor device 1, the semiconductor device 1 can operate while sufficiently exerting the property of high dielectric breakdown field that silicon carbide has. It should be noted that the above is applied similarly to a case where a nitride semiconductor is used instead of silicon carbide, and even in the case, the semiconductor device 1 can operate while sufficiently exerting the property of high dielectric breakdown field that the nitride semiconductor has.

(First Variation)

Figure 2:
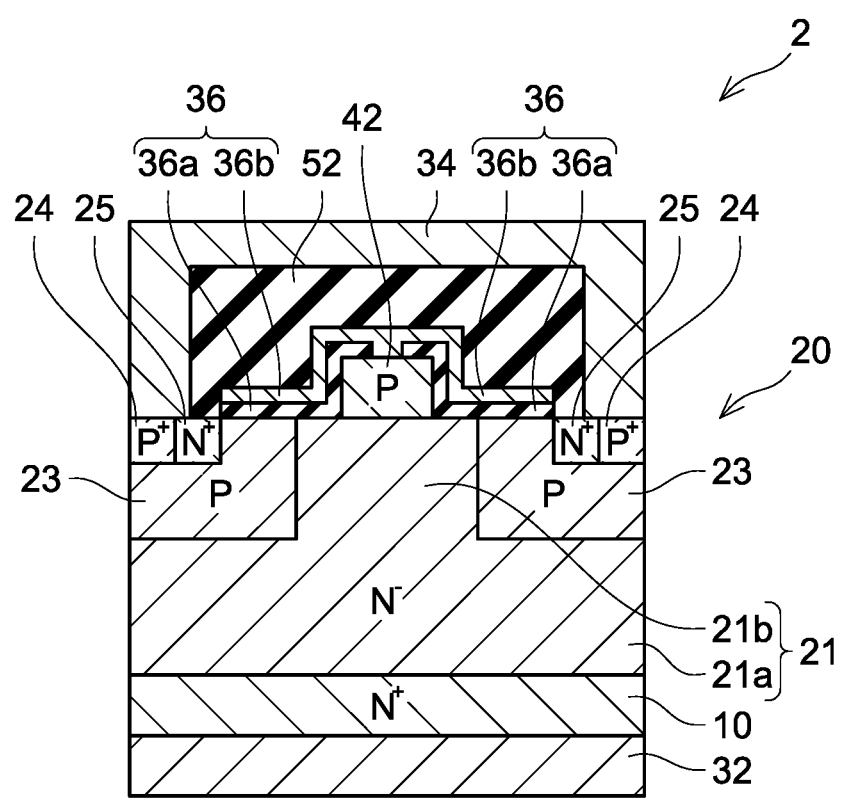
FIG. 2 schematically shows a cross sectional view of a main part of a semiconductor device according to a first variation.

A semiconductor device 2 of a variation shown in FIG. 2 is characterized in that the p-type semiconductor region 42 is in ohmic contact with the gate electrode 36b of the insulation gate section 36. In this variation, when the semiconductor device 2 is on, the junction surface between the p-type semiconductor region 42 and the vertical drift region 21b is forwardly biased, and holes are injected from the p-type semiconductor region 42 into the drift region 21. Due to this, a conductivity modulation occurs in the drift region 21, and thereby a drift resistance decreases. The semiconductor device 2 can have a low on-resistance.

Further, in the semiconductor device 2 as well, the p-type semiconductor region 42 is electrically connected to the gate electrode 36b, and thus holes are quickly supplied to the depletion layer in the p-type semiconductor region 42 when the semiconductor device 2 turns on. Due to this, an increase in turn-on loss can be suppressed in the semiconductor device 2 as well.

(Second Variation)

Figure 3:
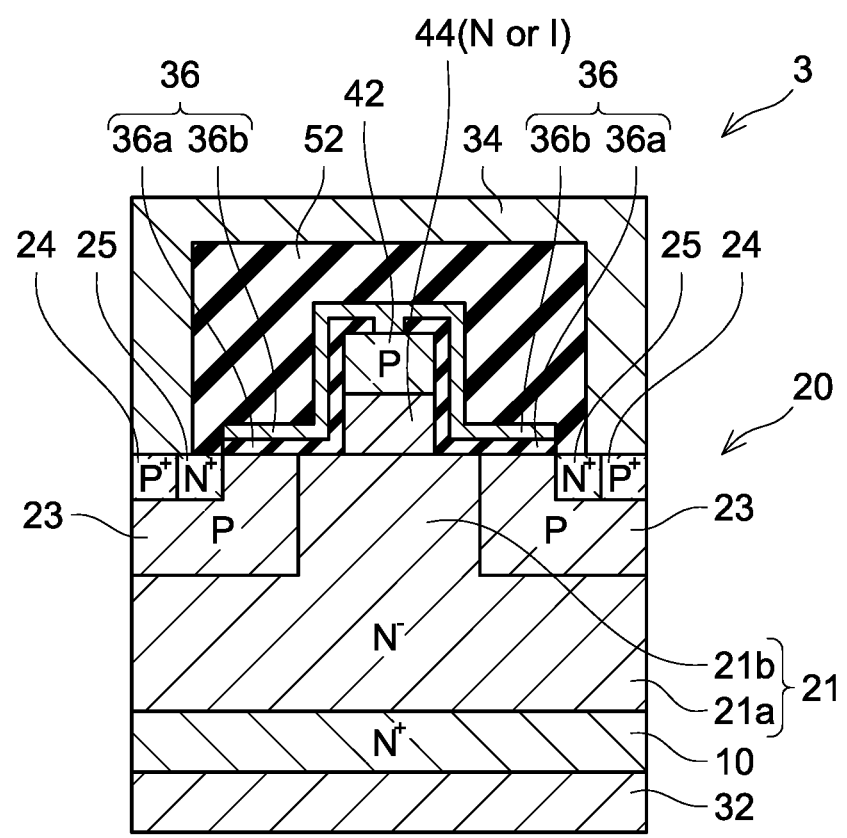
FIG. 3 schematically shows a cross sectional view of a main part of a semiconductor device according to a second variation.
Figure 4:
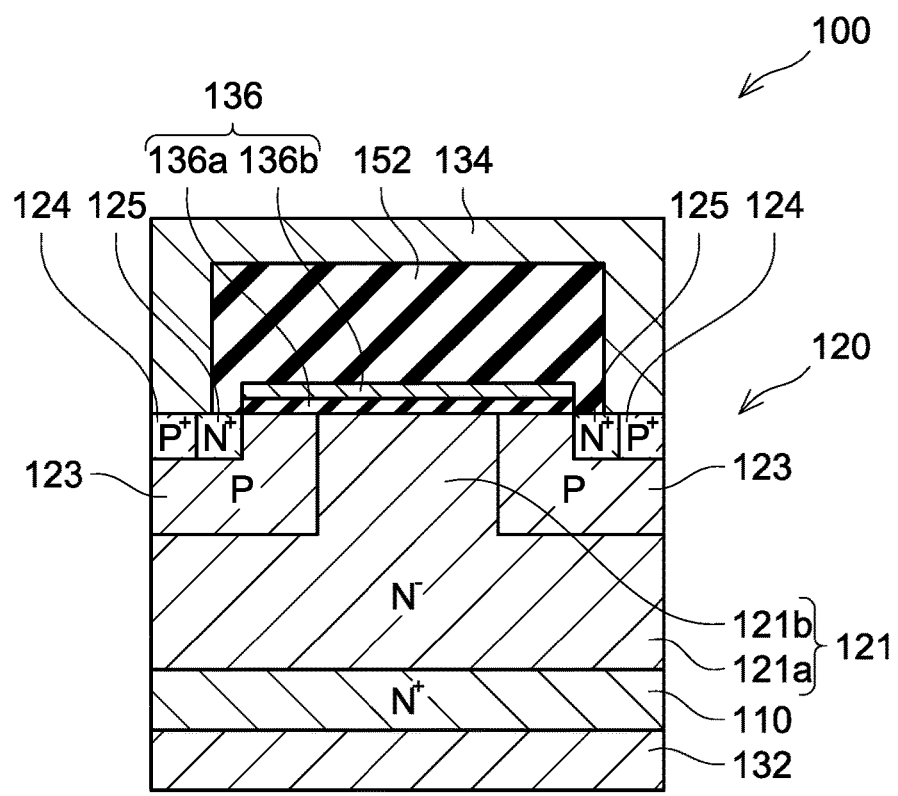
FIG. 4 schematically shows a cross sectional view of a main part of a conventional semiconductor device.

A semiconductor device 3 of a variation shown in FIG. 3 is characterized in that the semiconductor device 3 comprises an intermediate semiconductor region 44 of n-type or i-type between the p-type semiconductor region 42 and the vertical drift region 21b. Here, in the semiconductor device 3, the semiconductor substrate 10, the semiconductor layer 20, and the p-type semiconductor region 42 are made of gallium nitride (GaN), and the intermediate semiconductor region 44 is made of aluminum gallium nitride (AlGaN). Due to this, the intermediate semiconductor region 44 and the vertical drift region 21b are in a heterojunction, and two-dimensional electron gas is generated in the front surface portion of the vertical drift region 21b when the semiconductor device 3 is on. Since electron carriers are present in high concentration in the two-dimensional electron gas, an electric resistance in the front surface portion of the vertical drift region 21b greatly decreases. Due to this, an on-resistance of the semiconductor device 3 decreases.

A thickness and an impurity concentration of the intermediate semiconductor region 44 are adjusted such that the depletion layer extending from the p-type semiconductor region 42 extends across the intermediate semiconductor region 44 to be formed inside the vertical drift region 21b also when the semiconductor device 3 is off. Due to this, in the semiconductor device 3 as well, the front surface portion of the vertical drift region 21b is depleted by the depletion layer extending from the p-type semiconductor region 42, and thus electric field applied to the gate insulation film 36a of the insulation gate section 36 is alleviated.

It should be noted that in the semiconductor device 3, the intermediate semiconductor region 44 may be provided so as to be in contact with an entirety of the portion of the vertical drift region 21b that is disposed at the front surface of the semiconductor layer 20. Further, the p-type semiconductor region 42 may be provided so as to be opposed to the entirety of the portion of the vertical drift region 21b that is disposed at the front surface of the semiconductor layer 20. In this case, the two-dimensional electron gas is generated over a broader range in the front surface portion of the vertical drift region 21b, and thus the semiconductor device 3 can have a lower on-resistance.

Some of the technical elements disclosed herein will be listed hereinbelow. It should be noted that the respective technical elements are independent of one another, and are useful solely or in combinations. The combinations thereof are not limited to those described in the claims as originally filed.

A semiconductor device disclosed herein may comprise a semiconductor layer, an insulation gate section provided on a part of one of main surfaces of the semiconductor layer, and a first conductivity-type semiconductor region provided on another part of the one of main surfaces. The semiconductor layer may comprise a drift region being of a second conductivity type, a body region being of the first conductivity type, and a source region being of the second conductivity type. The drift region includes a vertical drift region disposed at the one of main surfaces. The body region is intervened by the vertical drift region (adjoins the vertical drift region), and disposed at the one of main surfaces. The source region is separated from the vertical drift region by the body region, and disposed at the one of main surfaces. The insulation gate section is opposed to a portion of the body region which separates the vertical drift region and the source region. Another layer may intervene between the insulation gate section and the semiconductor layer. The first conductivity-type semiconductor region is opposed to at least a part of a portion of the vertical drift region which is disposed at the one of main surfaces. Another layer may intervene between the first conductivity-type semiconductor region and the semiconductor layer.

In the above-described semiconductor device, the first conductivity-type semiconductor region is in contact with a part of the portion of the vertical drift region that is disposed at the one of the main surfaces of the semiconductor layer, and separated from the body region by the vertical drift region. Since the first conductivity-type semiconductor region and the vertical drift region are directly in contact with each other, a front surface portion of the vertical drift region is favorably depleted by a depletion layer extending from the first conductivity-type semiconductor region, and thus electric field applied to a gate insulation film of the insulation gate section can be favorably alleviated.

The above-described semiconductor device may further comprise a source electrode which covers the one of main surfaces and is electrically connected to the source region. Further, the first conductivity-type semiconductor region may be electrically connected to the source electrode. In this case, the depletion layer extending from the first conductivity-type semiconductor region into the vertical drift region quickly disappears when the semiconductor device turns on, and thus an increase in turn-on loss can be suppressed.

In the above-described semiconductor device, the first conductivity-type semiconductor region may be electrically connected to a gate electrode of the insulation gate section. In this case, when the semiconductor device is on, carriers are injected to the vertical drift region from the first conductivity-type semiconductor region, and a conductivity modulation occurs in the drift region. This semiconductor device can have a low on-resistance.

In the above-described semiconductor device, the semiconductor layer may be a silicon carbide semiconductor or a nitride semiconductor. Since the semiconductor device can alleviate electric field applied to the gate insulation film of the insulation gate section, it can operate while sufficiently exerting a property of high dielectric breakdown field that the silicon carbide semiconductor or the nitride semiconductor has.

Specific examples of the present invention have been described in detail, however, these are mere exemplary indications and thus do not limit the scope of the claims. The art described in the claims includes modifications and variations of the specific examples presented above. Technical features described in the description and the drawings may technically be useful alone or in various combinations, and are not limited to the combinations as originally claimed. Further, the art described in the description and the drawings may concurrently achieve a plurality of aims, and technical significance thereof resides in achieving any one of such aims.

What is claimed is:

1. A semiconductor device comprising:
   a semiconductor layer having main surfaces, the semiconductor layer comprising:
      a body region of a first conductivity type and disposed at one of the main surfaces;
      a vertical drift region of a second conductivity type, adjoining the body region, and disposed at the one main surface; and
      a source region of the second conductivity type, separated from the vertical drift region by the body region, and disposed at the one main surface;
   an insulation gate section provided on a part of the one main surface, the insulation gate section being opposed to a portion of the body region which separates the vertical drift region and the source region; and
   a first conductivity-type semiconductor region provided on another part of the one main surface, the first conductivity-type semiconductor region being opposed to at least a part of a portion of the vertical drift region which is disposed at the one main surface, and not provided between the source region and the vertical drift region.

2. The semiconductor device of claim 1, wherein
the first conductivity-type semiconductor region is in contact with a part of the portion of the vertical drift region which is disposed at the one main surface, and is separated from the body region by the vertical drift region.

3. The semiconductor device of claim 1, further comprising
   a source electrode which covers the one main surface and is electrically connected to the source region,
   wherein the first conductivity-type semiconductor region is electrically connected to the source electrode.

4. The semiconductor device of claim 1, wherein
the first conductivity-type semiconductor region is electrically connected to a gate electrode of the insulation gate section.

5. The semiconductor device of claim 1, wherein
the semiconductor layer is a silicon carbide semiconductor or a nitride semiconductor.

* * * * *